US012621981B2

(12) United States Patent
Jeong et al.

(10) Patent No.: US 12,621,981 B2
(45) Date of Patent: May 5, 2026

(54) SEMICONDUCTOR MEMORY DEVICE

(71) Applicant: SAMSUNG ELECTRONICS CO., LTD., Suwon-si (KR)

(72) Inventors: Euichul Jeong, Suwon-si (KR); Sang-Woon Lee, Suwon-si (KR); Sangho Lee, Suwon-si (KR); Moonyoung Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 422 days.

(21) Appl. No.: 18/369,552

(22) Filed: Sep. 18, 2023

(65) Prior Publication Data

US 2024/0130108 A1     Apr. 18, 2024

(30) Foreign Application Priority Data

Oct. 17, 2022     (KR) ......................... 10-2022-0133171

(51) Int. Cl.
H10B 12/00          (2023.01)

(52) U.S. Cl.
CPC ........... H10B 12/315 (2023.02); H10B 12/05 (2023.02)

(58) Field of Classification Search
CPC ...... H10B 12/315; H10B 12/05; H10B 12/00; H10B 12/488; H10B 12/34; H10B 12/48; H10B 12/482; G11C 8/14; G11C 11/4097
See application file for complete search history.

(56) References Cited

U.S. PATENT DOCUMENTS

| | | | |
|---|---|---|---|
| 7,387,931 B2 | 6/2008 | Seo et al. | |
| 7,482,229 B2 | 1/2009 | Juengling | |
| 8,405,137 B2 | 3/2013 | Huo et al. | |
| 8,742,493 B2 | 6/2014 | Kim et al. | |
| 8,860,127 B2 | 10/2014 | Cho et al. | |
| 11,127,744 B2 | 9/2021 | Servalli et al. | |
| 2015/0357336 A1 | 12/2015 | Sukekawa | |
| 2020/0395362 A1 | 12/2020 | Park | |
| 2023/0320077 A1 * | 10/2023 | Jeong ................... | H10D 30/611 |
| | | | 257/295 |
| 2023/0371243 A1 * | 11/2023 | Lee ...................... | H10B 12/488 |

* cited by examiner

*Primary Examiner* — Allison Bernstein
(74) *Attorney, Agent, or Firm* — Sughrue Mion, PLLC

(57)          ABSTRACT

A semiconductor memory device includes a substrate, a bit line on the substrate, word lines provided on the bit line and spaced apart in a first direction parallel to a top surface of the substrate, a back gate electrode provide between a pair of adjacent word lines among the word lines, active patterns provided between the back gate electrode and the pair of adjacent word lines, contact patterns respectively provided on the active patterns, a first back gate insulating pattern provided between the bit line and the back gate electrode, and a second back gate insulating pattern and a third back gate insulating pattern which are provided on the back gate electrode, where the back gate upper insulating pattern includes a material having a first dielectric constant and the back gate lower insulating pattern includes a material having a second dielectric constant that is greater than the first dielectric constant.

20 Claims, 23 Drawing Sheets

GOX1
AP2
AP1
BG
WLL
GOXL
130
BL
200

142
141
110

D3
D2

SEMICONDUCTOR MEMORY DEVICE

CROSS-REFERENCE TO RELATED APPLICATION

This application is based on and claims priority to Korean Patent Application No. 10-2022-0133171, filed on Oct. 17, 2022, in the Korean Intellectual Property Office, the disclosure of which is incorporated herein by reference in its entirety.

BACKGROUND

The present disclosure relates to a semiconductor memory device, and more particularly, to a semiconductor memory device with improved electrical characteristics and integration density.

An electronic system requiring data storage may require a semiconductor device capable of storing high-capacity data. To meet performance and price objectives of a semiconductor device while increasing data storage capacity of the semiconductor device, it may be required to increase an integration density of the semiconductor device. An integration density of a two-dimensional (2D) or planar semiconductor device may be mainly determined by an area where a unit memory cell occupies, and thus the integration density of the 2D or planar semiconductor device may be greatly affected by a technique of forming fine patterns. However, since high-priced apparatuses are needed to form fine patterns, the integration density of 2D semiconductor devices is still limited. Thus, semiconductor memory devices have been developed to improve their integration density, resistance and current driving capability.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide a semiconductor memory device with improved integration density and electrical characteristics.

Additional aspects will be set forth in part in the description which follows and, in part, will be apparent from the description, or may be learned by practice of the presented embodiments.

According to an aspect of an example embodiment, a semiconductor memory device may include a bit line extending in a first direction, a first word line extending in a second direction intersecting the first direction on the bit line, a second word line extending in the second direction and spaced apart from the first word line in the first direction, a back gate electrode extending in the second direction between the first word line and the second word line, first active patterns provided between the first word line and the back gate electrode, the first active patterns being spaced apart in the second direction, second active patterns provided between the second word line and the back gate electrode, the second active patterns being spaced apart in the second direction, contact patterns respectively connected to the first active patterns and the second active patterns, a back gate lower insulating pattern provided between the back gate electrode and the bit line, and a back gate upper insulating pattern provided on the back gate electrode, where the back gate upper insulating pattern may include a material having a first dielectric constant and the back gate lower insulating pattern may include a material having a second dielectric constant that is greater than the first dielectric constant.

According to an aspect of an example embodiment, a semiconductor memory device may include a substrate, a bit line on the substrate, word lines provided on the bit line and spaced apart in a first direction parallel to a top surface of the substrate, a back gate electrode provide between a pair of adjacent word lines among the word lines, active patterns provided between the back gate electrode and the pair of adjacent word lines, contact patterns respectively provided on the active patterns, a first back gate insulating pattern provided between the bit line and the back gate electrode, and a second back gate insulating pattern and a third back gate insulating pattern which are provided on the back gate electrode, where the back gate upper insulating pattern may include a material having a first dielectric constant and the back gate lower insulating pattern may include a material having a second dielectric constant that is greater than the first dielectric constant.

According to an aspect of an example embodiment, a semiconductor memory device may include a substrate, a bit line extending in a first direction on the substrate, a first active pattern, a second active pattern spaced apart from the first active pattern in the first direction on the bit line, a back gate electrode provided between the first active pattern and the second active pattern, the back gate electrode extending in a second direction and intersecting the bit line, a first word line provided adjacent to the first active pattern and extending in the second direction, a second word line provided adjacent to the second active pattern and extending in the second direction, at least one first gate insulating pattern provided between the first active pattern and the first word line, at least one second gate insulating pattern provided between the second active pattern and the second word line, at least one third gate insulating pattern provided between the first active pattern and the back gate electrode, at least one fourth gate insulating pattern provided between the second active pattern and the back gate electrode, contact patterns connected to the first active pattern and the second active pattern, a back gate lower insulating pattern provided between the bit line and the back gate electrode, a back gate upper insulating pattern provided on the back gate electrode and between the contact patterns, at least one first insulating pattern provided between the first word line and the bit line, at least one second insulating pattern provided between the first word line and a corresponding contact pattern of the contact patterns, at least one third insulating pattern provided between the second word line and the bit line, at least one fourth insulating pattern provided between the second word line and a corresponding contact pattern of the contact patterns, and data storage patterns respectively connected to the contact patterns, where the back gate upper insulating pattern may include a material having a first dielectric constant and the back gate lower insulating pattern may include a material having a second dielectric constant that is greater than the first dielectric constant.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
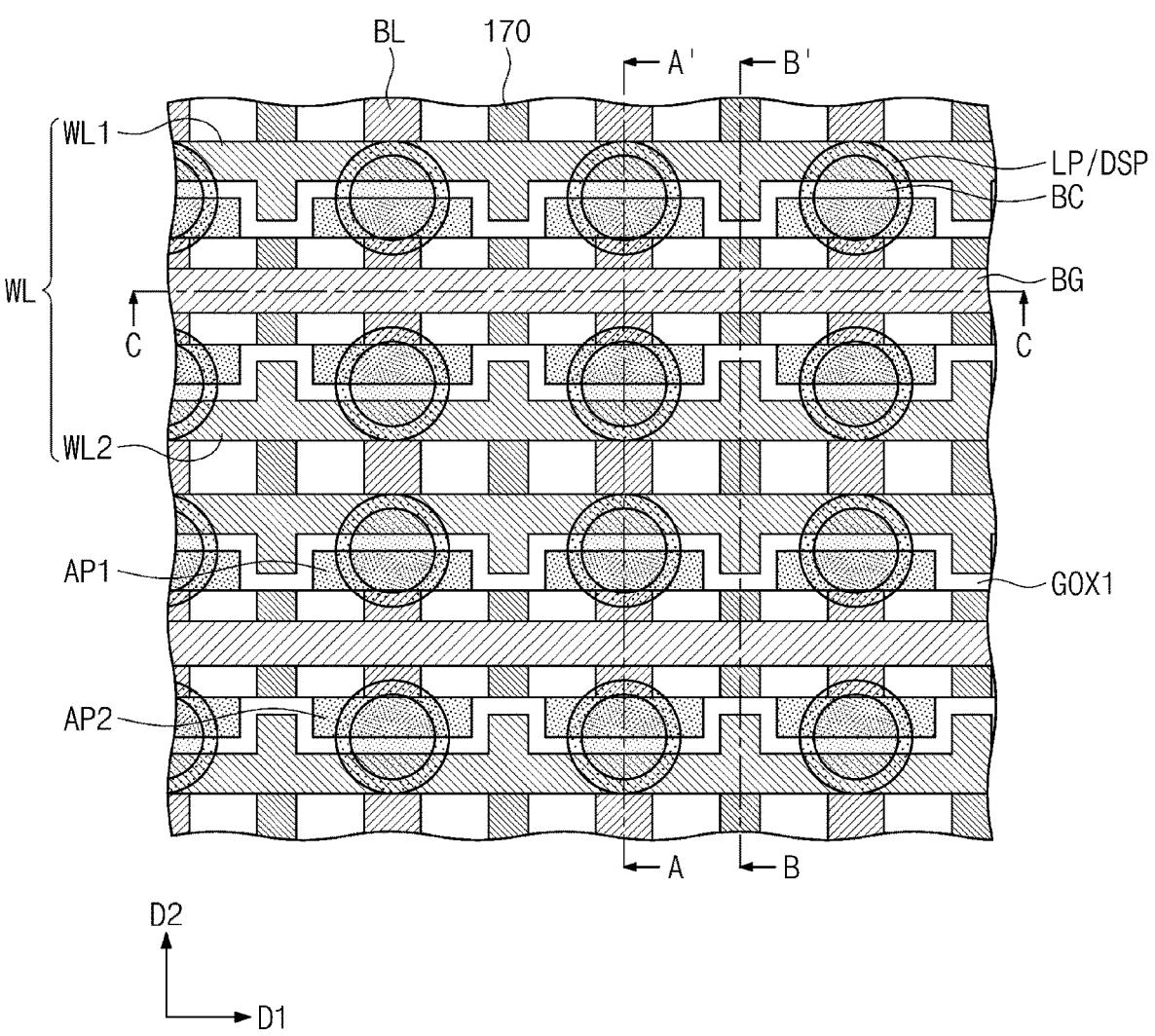
FIG. 1 is a diagram illustrating a semiconductor memory device according to some embodiments of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2A:
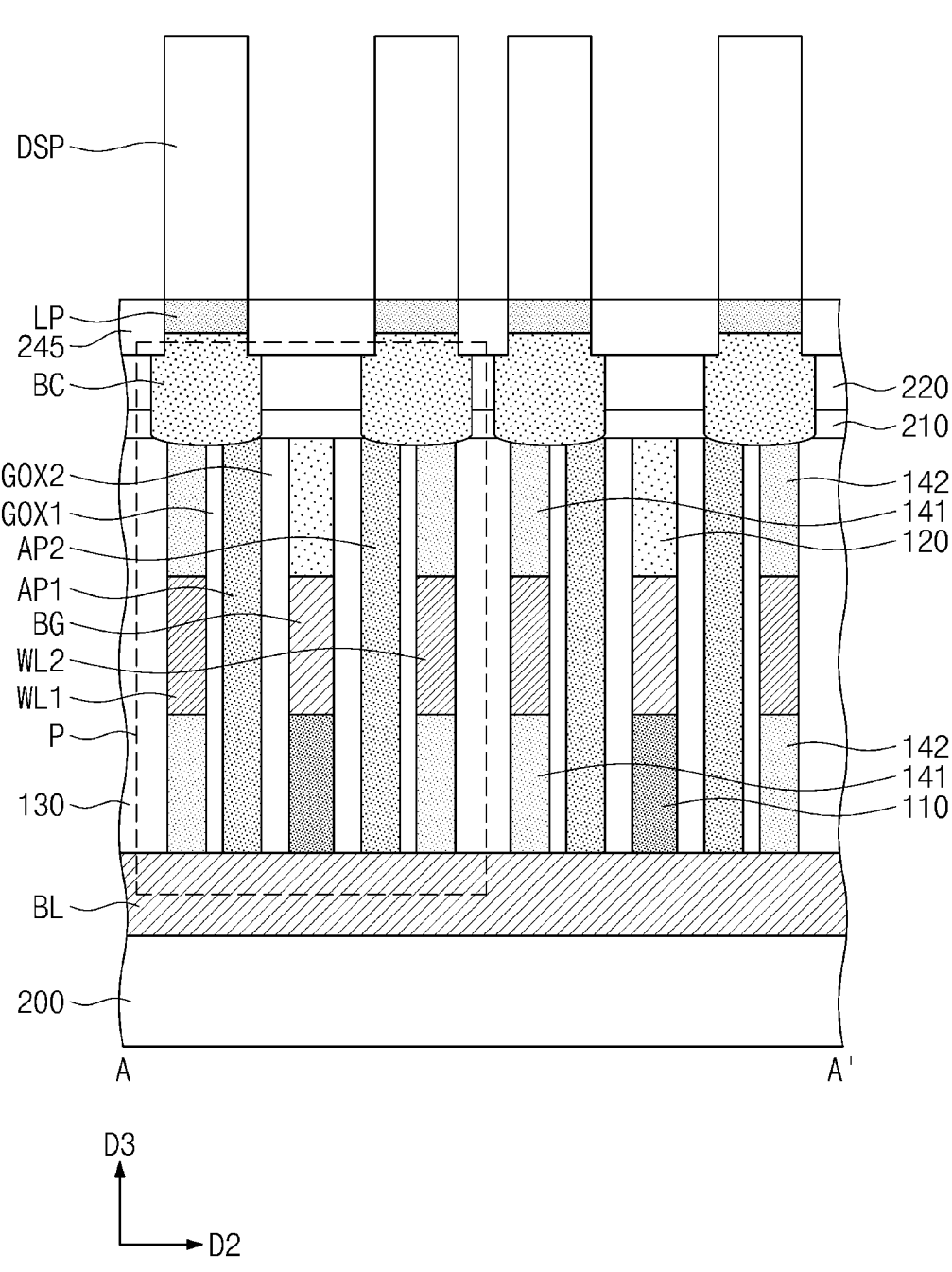
FIG. 2A is a cross-sectional view taken along a line A-A' of FIG. 1 to illustrate a semiconductor memory device according to some embodiments of the disclosure.
Figure 2B:
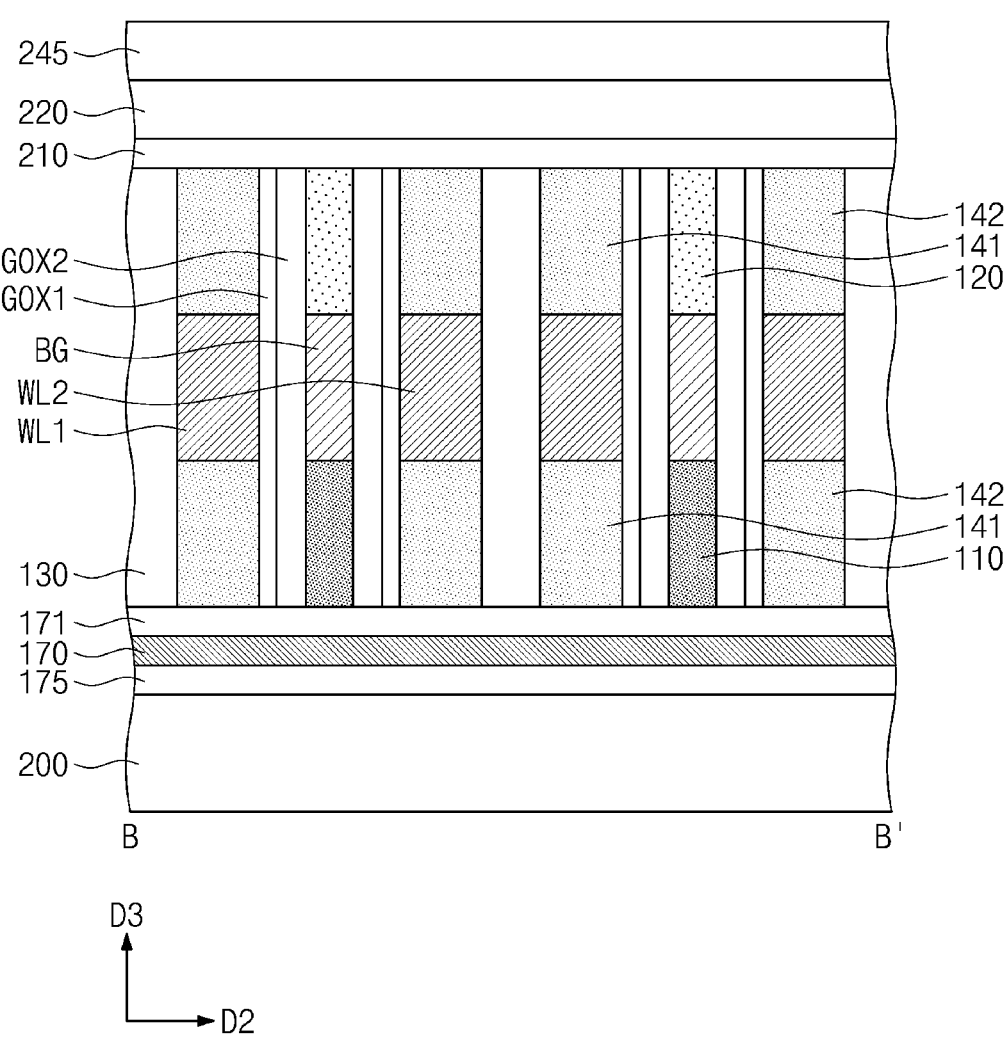
FIG. 2B is a cross-sectional view taken along a line B-B' of FIG. 1 to illustrate a semiconductor memory device according to some embodiments of the disclosure.
Figure 2C:
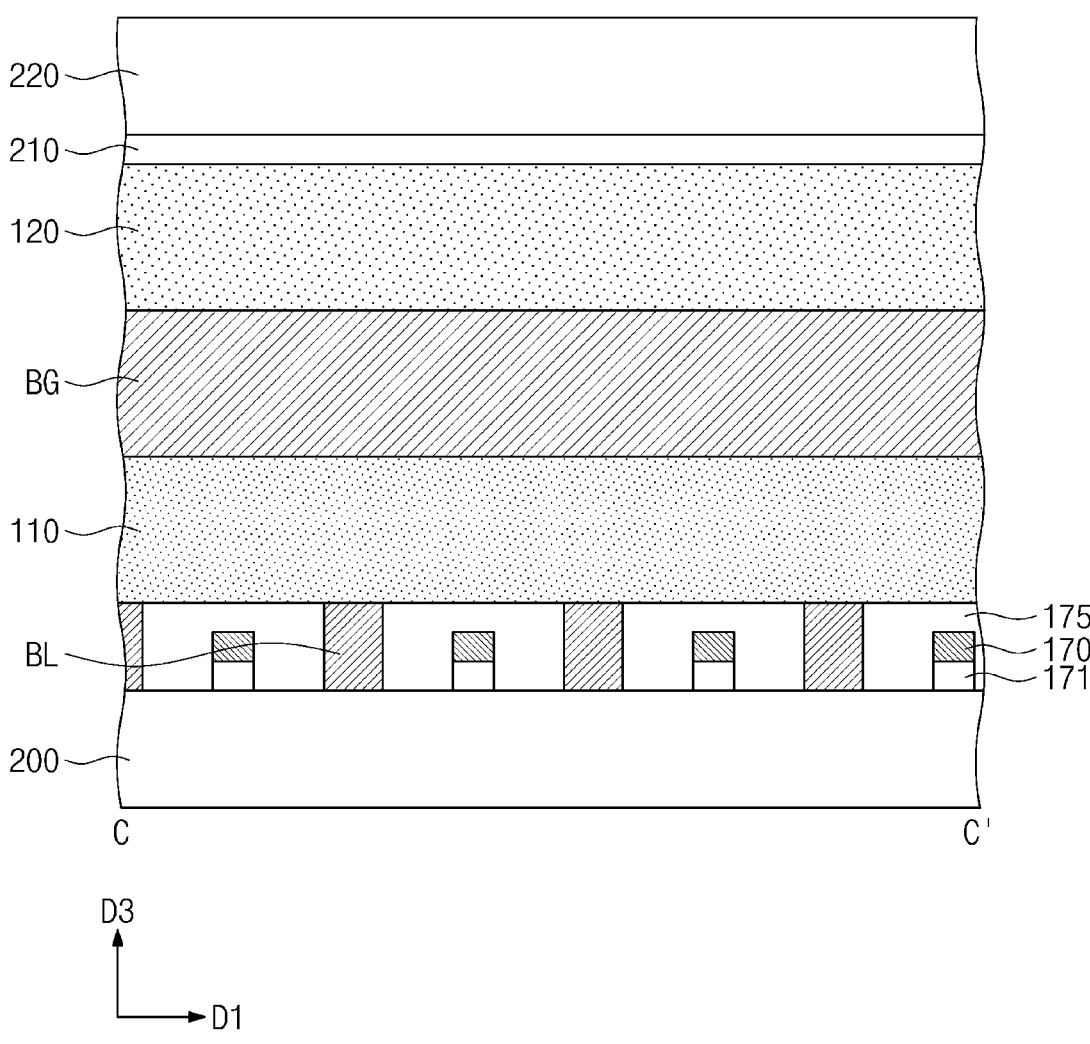
FIG. 2C is a cross-sectional view taken along a line C-C' of FIG. 1 to illustrate a semiconductor memory device according to some embodiments of the disclosure.

FIG. 1 is a diagram illustrating a semiconductor memory device according to some embodiments of the disclosure. FIG. 2A is a cross-sectional view taken along a line A-A' of FIG. 1 to illustrate a semiconductor memory device according to some embodiments of the disclosure. FIG. 2B is a cross-sectional view taken along a line B-B' of FIG. 1 to illustrate a semiconductor memory device according to some embodiments of the disclosure. FIG. 2C is a cross-sectional view taken along a line C-C' of FIG. 1 to illustrate a semiconductor memory device according to some embodiments of the disclosure.

Referring to FIGS. 1 and 2A to 2C, bit lines BL may be disposed on a substrate 200 and may be spaced apart from each other in a first direction D1. The bit lines BL may extend in parallel to each other in a second direction D2 intersecting the first direction D1.

The substrate 200 may include a material (e.g., a silicon wafer) having semiconductor properties, an insulating material (e.g., glass), or a semiconductor or conductor covered by an insulating material.

For example, the bit lines BL may include at least one of, but not limited to, doped poly-silicon, a metal (e.g., Al, Cu, Ti, Ta, Ru, W, Mo, Pt, Ni, or Co), a conductive metal nitride (e.g., TiN, TaN, WN, NbN, TiAlN, TiSiN, TaSiN, or RuTiN), a conductive metal silicide, and a conductive metal oxide (e.g., PtO, $RuO2$, $IrO2$, $SrRuO3$ (SRO), $(Ba,Sr)RuO3$ (BSRO), $CaRuO3$ (CRO), or LSCo). The bit lines BL may include a single layer or multi-layer of the aforementioned materials. In some embodiments, the bit lines BL may include two-dimensional materials and three-dimensional materials. For example, the bit lines BL may include at least one of carbon-based two dimensional materials (e.g. grapheme), carbon-based three-dimensional materials (e.g. carbon nanotube), and combinations thereof.

In some embodiments, the semiconductor memory device may include gap structures 170 between the bit lines BL. Each of the gap structures 170 may be surrounded by line insulating layers 171 and 175.

The gap structures 170 may extend in the second direction D2 in parallel to each other. The gap structures 170 may be provided in the line insulating layers 171 and 175, and top surfaces of the gap structures 170 may be located at a lower level than top surfaces of the bit lines BL.

In some embodiments, each of the gap structures 170 may be formed of a conductive material and may include an air gap or a void therein. In some embodiments, the gap structures 170 may be air gaps surrounded by the line insulating layers 171 and 175. Each of the gap structures 170 may reduce coupling noise between the bit lines BL adjacent to each other. For example, the gap structures 170 may be shielding lines formed of a conductive material.

First and second active patterns AP1 and AP2 may be alternately arranged in the second direction D2 on each of the bit lines BL. The first active patterns AP1 may be spaced apart from each other in the first direction D1, and the second active patterns AP2 may be spaced apart from each other in the first direction D1. In other words, the first and second active patterns AP1 and AP2 may be two-dimensionally arranged in the first direction D1 and the second direction D2 which intersect each other.

In some embodiments, the first and second active patterns AP1 and AP2 may be formed of a single-crystalline semiconductor material. For example, the first and second active patterns AP1 and AP2 may be formed of single-crystalline silicon.

Each of the first and second active patterns AP1 and AP2 may have a length in the first direction D1, a width in the second direction D2, and a height in a third direction D3 perpendicular to the first and second directions D1 and D2. Each of the first and second active patterns AP1 and AP2 may have a substantially uniform width. The width of each of the first and second active patterns AP1 and AP2 may range from several nanometers (nm) to several tens nm. For example, the width of each of the first and second active patterns AP1 and AP2 may range from about 1 nm to about 30 nm (e.g., from about 1 nm to about 10 nm). The length of each of the first and second active patterns AP1 and AP2 may be greater than a line width of each of the bit lines BL in the first direction D1.

Figure 3A:
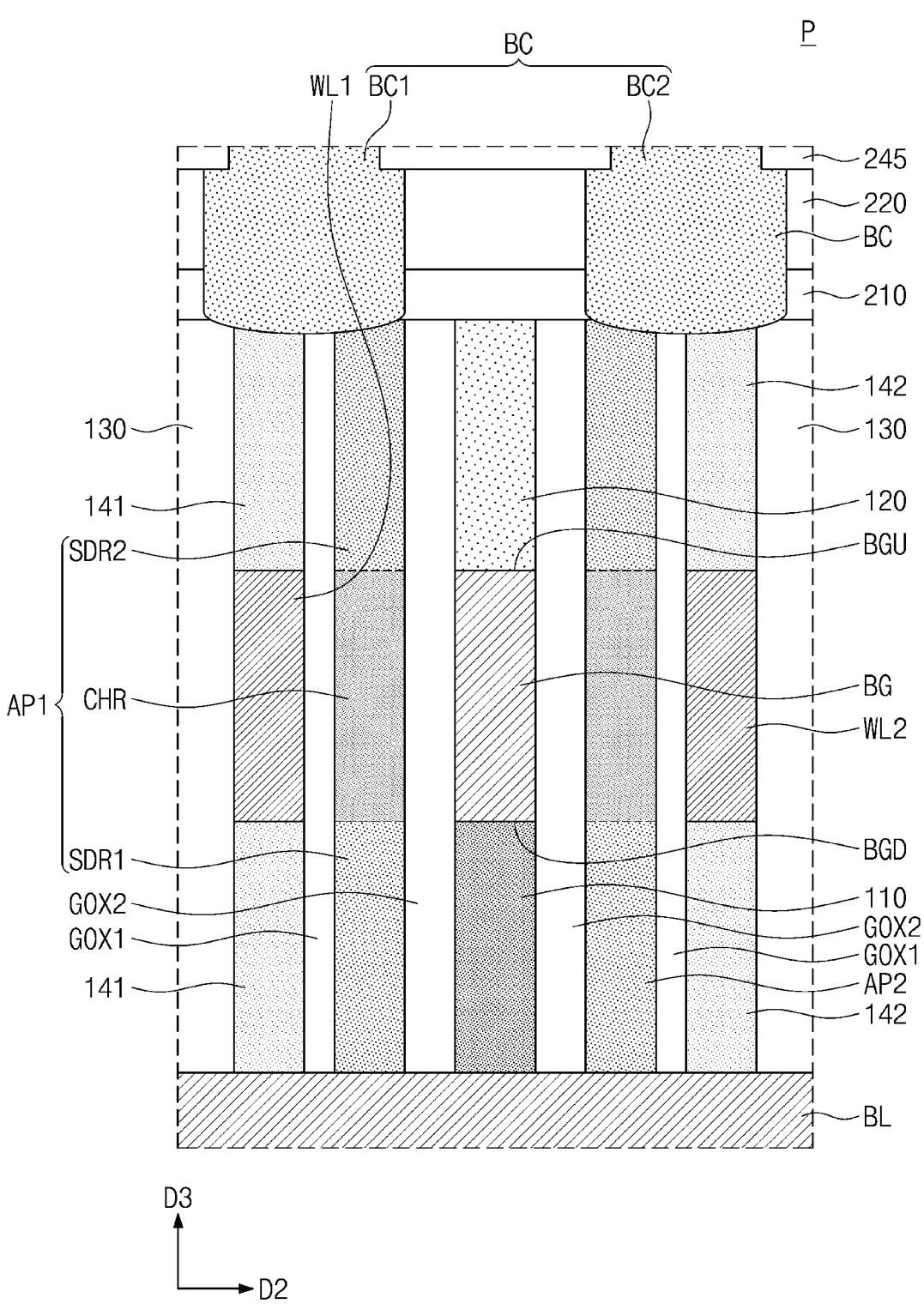
FIG. 3A is a diagram of a portion 'P' of FIG. 2A to illustrate a portion of a semiconductor memory device according to some embodiments of the disclosure.

FIG. 3A is a diagram of a portion 'P' of FIG. 2A to illustrate a portion of a semiconductor memory device according to some embodiments of the disclosure. Referring to FIG. 3A, each of the first and second active patterns AP1 and AP2 may include a first dopant region SDR1 adjacent to each of the bit lines BL, a second dopant region SDR2 adjacent to each of contact patterns BC, and a channel region CHR between the first and second dopant regions SDR1 and SDR2. The first and second dopant regions SDR1 and SDR2 may be regions in the first and second active patterns AP1 and AP2, which are doped with dopants, and a dopant concentration in the first and second dopant regions SDR1 and SDR2 may be greater than a dopant concentration in the channel region CHR.

The channel regions CHR of the first and second active patterns AP1 and AP2 may be controlled by first and second word lines WL1 and WL2 and back gate electrodes BG when the semiconductor memory device operates. In the case in which the first and second active patterns AP1 and AP2 are formed of the single-crystalline semiconductor material, leakage currents may be reduced when the semiconductor memory device operates.

The back gate electrodes BG may be disposed on the bit lines BL and may be spaced apart from each other in the second direction D2 by a certain distance. The back gate electrodes BG may extend in the first direction D1 to intersect the bit lines BL.

Each of the back gate electrodes BG may be disposed between the first and second active patterns AP1 and AP2 adjacent to each other in the second direction D2. In other words, the first active patterns AP1 may be disposed at a side of each of the back gate electrodes BG, and the second active patterns AP2 may be disposed at another side of each of the back gate electrodes BG.

For example, the back gate electrodes BG may include doped poly-silicon, a conductive metal nitride (e.g., titanium nitride, tantalum nitride, etc.), a metal (e.g., tungsten, titanium, tantalum, etc.), a conductive metal silicide, a conductive metal oxide, or any combination thereof.

A negative voltage may be applied to the back gate electrodes BG in the operation of the semiconductor memory device to increase a threshold voltage of a vertical channel transistor. In other words, the back gate electrode BG supplied with the negative voltage may prevent a leakage current property of the vertical channel transistor from being deteriorated by a reduction in the threshold voltage which may be caused by a reduction in size of the vertical channel transistor.

A back gate lower insulating pattern 110 may be disposed between each of the back gate electrodes BG and the bit line BL. The back gate lower insulating pattern 110 may be referred to as a first back gate insulating pattern 110. The back gate lower insulating pattern 110 may be disposed between each of the back gate electrodes BG and the bit lines BL. A top surface of the back gate lower insulating pattern 110 may contact a bottom surface BGD of the back gate electrode BG. A bottom surface of the back gate lower insulating pattern 110 may contact the bit lines BL. The back gate lower insulating pattern 110 may extend in the first direction D1 in parallel to the back gate electrode BG. For example, the back gate lower insulating pattern 110 may include silicon oxide, silicon oxynitride, or silicon nitride.

A back gate upper insulating pattern 120 may be disposed on each of the back gate electrodes BG. The back gate upper insulating pattern 120 may be disposed between each of the back gate electrodes BG and the contact patterns BC. The back gate upper insulating pattern 120 may be disposed between each of the back gate electrodes BG and an etch stop layer 210. A bottom surface of the back gate upper insulating pattern 120 may contact a top surface BGU of the back gate electrode BG. The back gate upper insulating pattern 120 may extend in the third direction D3 so as to contact the etch stop layer 210. The back gate upper insulating pattern 120 may extend in the first direction D1 in parallel to the back gate electrode BG. The back gate upper insulating pattern 120 and the back gate lower insulating pattern 110 may be vertically spaced apart from each other in the third direction D3 with the back gate electrode BG interposed therebetween.

The back gate upper insulating pattern 120 may include a material having a dielectric constant lower than that of the back gate lower insulating pattern 110. The back gate upper insulating pattern 120 may include a low-k dielectric material. For example, the back gate upper insulating pattern 120 may include a material having a dielectric constant of 1 to 4. For example, the back gate upper insulating pattern 120 may include at least one of silicon oxide, SiOC, and air.

Word lines WL may be disposed on the substrate 200. The word lines WL may be spaced apart from each other in the second direction D2. The word lines WL may extend in the first direction D1 on the bit lines BL. The word lines WL may include first word lines WL1 and second word lines WL2. The first word lines WL1 and the second word lines WL2 may be alternately arranged in the second direction D2.

The first word line WL1 may be disposed at a side of each of the first active patterns AP1, and the second word line WL2 may be disposed at another side of each of the second active patterns AP2. The first and second word lines WL1 and WL2 may be vertically spaced apart from the bit lines BL and the contact patterns BC. In other words, the first and second word lines WL1 and WL2 may be located between the bit lines BL and the contact patterns BC when viewed in a vertical view.

Each of the first active patterns AP1 may be disposed between the first word line WL1 and each of the back gate electrodes BG. Each of the second active patterns AP2 may be disposed between the second word line WL2 and each of the back gate electrodes BG. Heights of the first and second word lines WL1 and WL2 in a vertical direction (e.g., the third direction D3) may be less than the heights of the first and second active patterns AP1 and AP2 in the vertical direction. The first and second word lines WL1 and WL2 may be located at a level different from that of the back gate electrode BG in the vertical direction.

For example, the first and second word lines WL1 and WL2 may include doped poly-silicon, a metal, a conductive metal nitride, a conductive metal silicide, a conductive metal oxide, or any combination thereof.

A first insulating pattern 141 may be disposed between the first word line WL1 and the bit lines BL and between the first word line WL1 and the contact patterns BC. The first word line WL1 may be spaced apart from the bit lines BL and the contact patterns BC with the first insulating pattern 141 interposed therebetween. In other words, the first word line WL1 may not contact the bit lines BL and the contact patterns BC. The first insulating pattern 141 may contact a top surface and a bottom surface of the first word line WL1. The first insulating pattern 141 may extend along the top surface and the bottom surface of the first word line WL1. The first insulating pattern 141 may extend in the first direction D1 in parallel to the first word line WL1. For example, the first insulating pattern 141 may be formed of silicon oxide, silicon oxynitride, silicon nitride, or any combination thereof.

A second insulating pattern 142 may be disposed between the second word line WL2 and the bit lines BL and between the second word line WL2 and the contact patterns BC. The second word line WL2 may be spaced apart from the bit lines BL and the contact patterns BC with the second insulating pattern 142 interposed therebetween. In other words, the second word line WL2 may not contact the bit lines BL and the contact patterns BC. The second insulating pattern 142 may contact a top surface and a bottom surface of the second word line WL2. The second insulating pattern 142 may extend along the top surface and the bottom surface of the second word line WL2. The second insulating pattern 142 may extend in the first direction D1 in parallel to the second word line WL2. For example, the second insulating pattern 142 may be formed of silicon oxide, silicon oxynitride, silicon nitride, or any combination thereof.

A third insulating pattern 130 may be disposed on the bit lines BL. The third insulating pattern 130 may be disposed between the second word line WL2 and the first word line WL1 which are adjacent to each other. The first and second word lines WL1 and WL2 may be separated from each other by the third insulating pattern 130. The third insulating pattern 130 may extend in the first direction D1 between the first and second word lines WL1 and WL2. For example, the third insulating pattern 130 may include silicon oxide.

A first gate insulating pattern GOX1 may be disposed on the bit lines BL. The first gate insulating pattern GOX1 may be disposed between the first word line WL1 and the first active patterns AP1 and between the second word line WL2 and the second active patterns AP2. The first gate insulating pattern GOX1 may extend in the first direction D1 in parallel to the first and second word lines WL1 and WL2.

A second gate insulating pattern GOX2 may be disposed on the bit lines BL. The second gate insulating pattern GOX2 may be disposed between the back gate electrode BG and the first active patterns AP1 and between the back gate electrode BG and the second active patterns AP2. The second gate insulating pattern GOX2 may extend in the first direction D1 in parallel to the back gate electrode BG.

The first and second gate insulating patterns GOX1 and GOX2 may cover or at least partially cover side surfaces of the first and second active patterns AP1 and AP2. The first and second gate insulating patterns GOX1 and GOX2 may be disposed between the etch stop layer 210 and the bit lines BL. The first and second gate insulating patterns GOX1 and GOX2 may have substantially uniform thicknesses.

The first and second gate insulating patterns GOX1 and GOX2 may be formed of silicon oxide, silicon oxynitride, a high-k dielectric material having a dielectric constant higher than that of silicon oxide, or any combination thereof. The high-k dielectric material may be formed of a metal oxide or a metal oxynitride. For example, the high-k dielectric material usable as a gate insulating layer may be formed of, but not limited to, HfO2, HfSiO, HfSiON, HfTaO, HfTiO, HfZrO, ZrO2, Al2O3, or any combination thereof.

The contact patterns BC may penetrate an interlayer insulating layer 220 and the etch stop layer 210 so as to be connected to the first and second active patterns AP1 and AP2, respectively. In other words, the contact patterns BC may be connected to the second dopant regions SDR2 of the first and second active patterns AP1 and AP2, respectively. Each of the contact patterns BC may have a lower width greater than an upper width thereof. The contact patterns BC adjacent to each other may be separated from each other by separation insulating patterns 245. Each of the contact patterns BC may have various shapes including at least one of a circular shape, an elliptical shape, a rectangular shape, a square shape, a lozenge shape and a hexagonal shape, when viewed in a plan view.

The back gate upper insulating pattern 120 may be disposed between the contact patterns BC adjacent to each other in the second direction D2, when viewed in a plan view. The contact patterns BC may include first contact patterns BC1 connected to the first active patterns AP1, and second contact patterns BC2 connected to the second active patterns AP2. At least a portion of each of the first contact patterns BC1 may be spaced apart from at least a portion of each of the second contact patterns BC2 with the back gate upper insulating pattern 120 interposed therebetween, when viewed in a plan view.

The contact patterns BC may be formed of, but not limited to, doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof.

Landing pads LP may be disposed on the contact patterns BC. Each of the landing pads LP may have various shapes including at least one of a circular shape, an elliptical shape, a rectangular shape, a square shape, a lozenge shape and a hexagonal shape, when viewed in a plan view.

The separation insulating patterns 245 may be disposed between the landing pads LP. The landing pads LP may be arranged in a matrix form in the first direction D1 and the second direction D2 when viewed in a plan view. Top surfaces of the landing pads LP may be substantially coplanar with top surfaces of the separation insulating patterns 245.

The landing pads LP may be formed of, but not limited to, doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof.

Data storage patterns DSP may be disposed on the landing pads LP, respectively. The data storage patterns DSP may be electrically connected to the first and second active patterns AP1 and AP2, respectively. The data storage patterns DSP may be arranged in a matrix form in the first direction D1 and the second direction D2. Each of the data storage patterns DSP may completely or partially overlap with each of the landing pads LP. Each of the data storage patterns DSP may contact the whole or a portion of a top surface of each of the landing pads LP.

In some embodiments, each of the data storage patterns DSP may be a capacitor and may include lower and upper electrodes and a capacitor dielectric layer disposed therebetween. Alternatively, each of the data storage patterns DSP may be a variable resistance pattern switchable between two resistance states by an electrical pulse applied thereto. For example, the data storage patterns DSP may include at least one of a phase-change material of which a crystal state is changeable depending on the amount of a current, a perovskite compound, a transition metal oxide, a magnetic material, a ferromagnetic material, or an antiferromagnetic material.

Figure 3B:
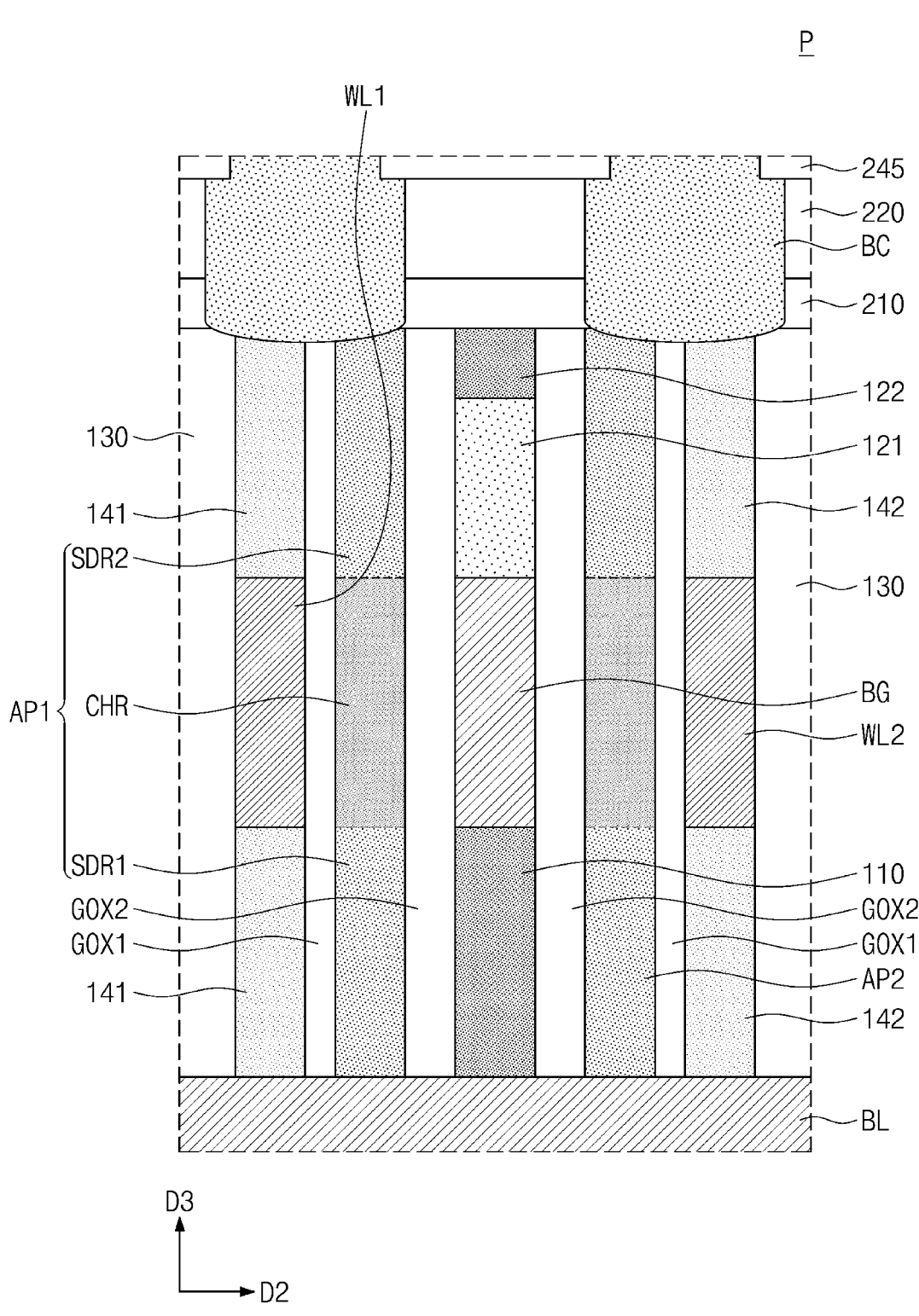
FIG. 3B is a diagram of the portion 'P' of FIG. 2A to illustrate a portion of a semiconductor memory device according to some embodiments of the disclosure.

FIG. 3B is a diagram of the portion 'P' of FIG. 2A to illustrate a portion of a semiconductor memory device according to some embodiments of the disclosure. Hereinafter, differences between the present embodiments and the above embodiments of FIGS. 1, 2A to 2C and 3A will be mainly described and similar aspects previously described may be omitted for ease and convenience in explanation.

Referring to FIG. 3B, a second back gate insulating pattern 121 may be disposed on each of the back gate electrodes BG. The second back gate insulating pattern 121 may contact the top surface of each of the back gate electrodes BG. The second back gate insulating pattern 121 may extend in the first direction D1 in parallel to the back gate electrode BG.

A third back gate insulating pattern 122 may be disposed on the second back gate insulating pattern 121. The second back gate insulating pattern 121 may be disposed between the back gate electrode BG and the third back gate insulating pattern 122. The third back gate insulating pattern 122 may be disposed between the second back gate insulating pattern 121 and the etch stop layer 210. The third back gate insulating pattern 122 may contact a top surface of the second back gate insulating pattern 121. The third back gate insulating pattern 122 may extend in the first direction D1 in parallel to the back gate electrode BG.

The second back gate insulating pattern 121 may include a material having a dielectric constant lower than that of the third back gate insulating pattern 122 (i.e., the second back gate insulating pattern 121 may include a material having a first dielectric constant that is lower than a second dielectric constant of a material of the third back gate insulating pattern 122). The second back gate insulating pattern 121 may include a low-k dielectric material. For example, the second back gate insulating pattern 121 may include a material having a dielectric constant of about 1 to about 4. For example, the second back gate insulating pattern 121 may include at least one of silicon oxide, SiOC, and air. For example, the third back gate insulating pattern 122 may include silicon nitride.

Figure 3C:
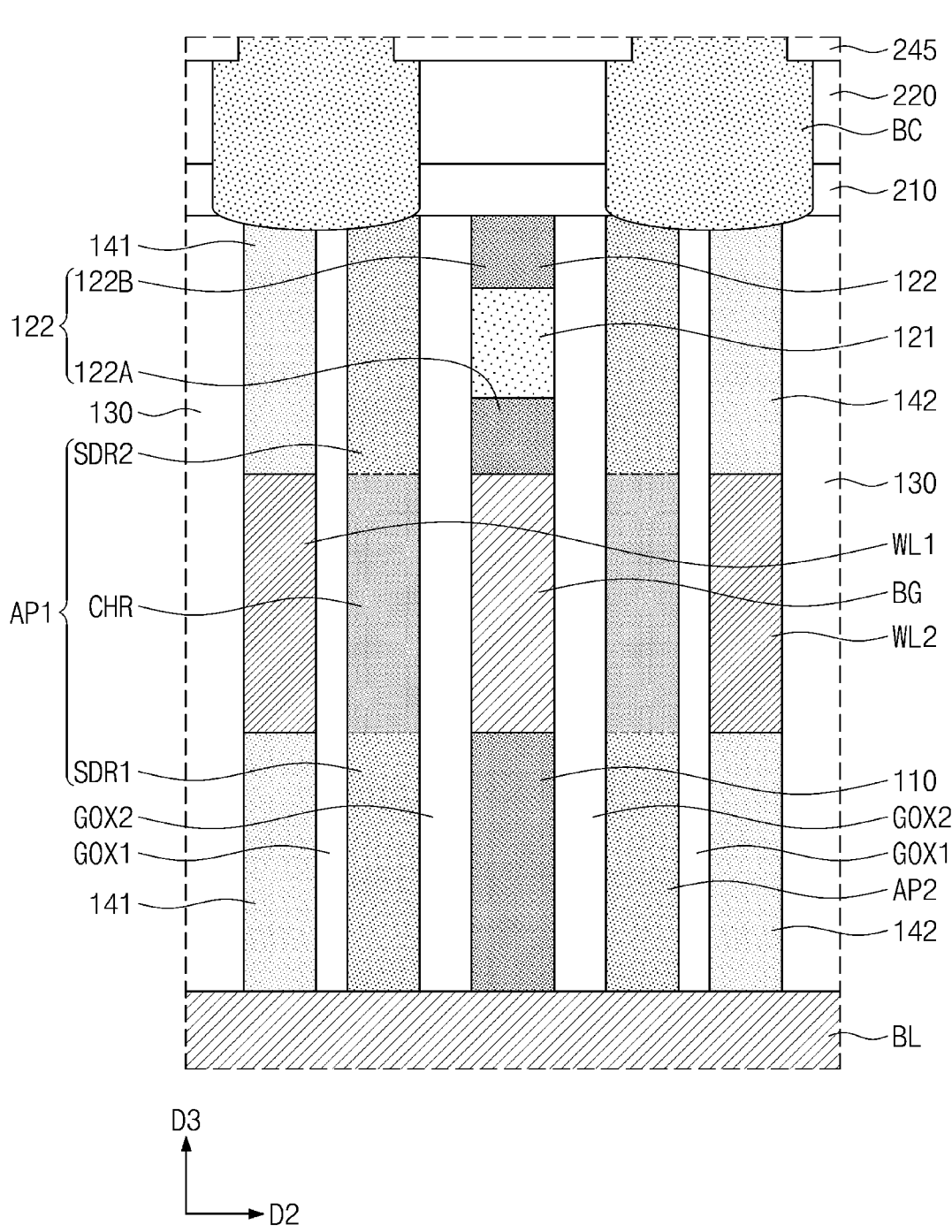
FIG. 3C is a diagram of the portion 'P' of FIG. 2A to illustrate a portion of a semiconductor memory device according to some embodiments of the disclosure.

FIG. 3C is a diagram of the portion 'P' of FIG. 2A to illustrate a portion of a semiconductor memory device according to some embodiments of the disclosure. Hereinafter, differences between the present embodiments and the above embodiments of FIGS. 1, 2A to 2C and 3A will be mainly described and similar aspects previously described may be omitted for ease and convenience in explanation.

Referring to FIG. 3C, a second back gate insulating pattern 121 may be disposed on each of the back gate electrodes BG. The second back gate insulating pattern 121 may extend in the first direction D1 in parallel to the back gate electrode BG.

A third back gate insulating pattern 122 may be disposed on each of the back gate electrodes BG. A portion 122A of the third back gate insulating pattern 122 may be disposed between the back gate electrode BG and the second back gate insulating pattern 121, and a remaining portion 122B of the third back gate insulating pattern 122 may be disposed on the second back gate insulating pattern 121. The second back gate insulating pattern 121 may be disposed between the portion 122A and the remaining portion 122B of the third back gate insulating pattern 122. The remaining portion 122B of the third back gate insulating pattern 122 may be disposed between the second back gate insulating pattern 121 and the etch stop layer 210. The portion 122A of the third back gate insulating pattern 122 may contact the top surface of each of the back gate electrodes BG. The third back gate insulating pattern 122 may extend along a top surface and a bottom surface of the second back gate insulating pattern 121. The second back gate insulating pattern 121 may be spaced apart from the back gate electrode BG with the third back gate insulating pattern 122 interposed therebetween. The third back gate insulating pattern 122 may extend in the first direction D1 in parallel to the back gate electrode BG.

The second back gate insulating pattern 121 may include a material having a dielectric constant lower than that of the third back gate insulating pattern 122. The second back gate insulating pattern 121 may include a low-k dielectric material. For example, the second back gate insulating pattern 121 may include a material having a dielectric constant of about 1 to about 4. For example, the second back gate insulating pattern 121 may include at least one of silicon oxide, SiOC, and air. For example, the third back gate insulating pattern 122 may include silicon nitride.

Figure 3D:
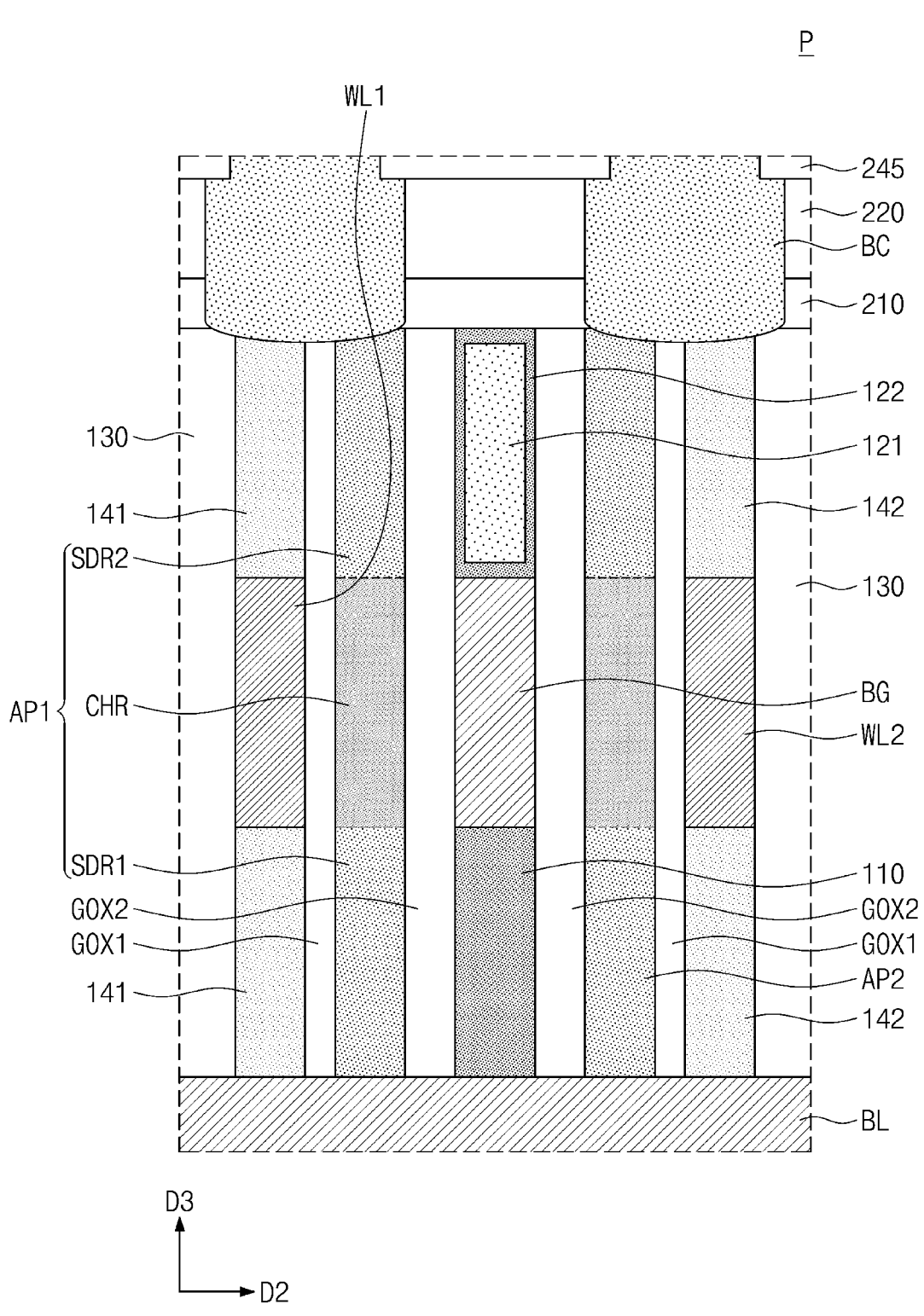
FIG. 3D is corresponding diagram of the portion 'P' of FIG. 2A to illustrate a portion of a semiconductor memory device according to some embodiments of the disclosure.

FIG. 3D is corresponding diagram of the portion 'P' of FIG. 2A to illustrate a portion of a semiconductor memory device according to some embodiments of the disclosure. Hereinafter, differences between the present embodiments and the above embodiments of FIGS. 1, 2A to 2C and 3A will be mainly described and similar aspects previously described may be omitted for ease and convenience in explanation.

Referring to FIG. 3D, a second back gate insulating pattern 121 may be disposed on each of the back gate electrodes BG. The second back gate insulating pattern 121 may extend in the first direction D1 in parallel to the back gate electrode BG.

A third back gate insulating pattern 122 may be disposed on each of the back gate electrodes BG. The third back gate insulating pattern 122 may surround (or at least partially surround) the second back gate insulating pattern 121. The third back gate insulating pattern 122 may extend along side surfaces of the second back gate insulating pattern 121. The third back gate insulating pattern 122 may contact the top surface of each of the back gate electrodes BG. The second back gate insulating pattern 121 may be spaced apart from the back gate electrode BG with the third back gate insulating pattern 122 interposed therebetween. The third back gate insulating pattern 122 may extend in the first direction D1 in parallel to the back gate electrode BG.

The second back gate insulating pattern 121 may include a material having a dielectric constant lower than that of the third back gate insulating pattern 122. The second back gate insulating pattern 121 may include a low-k dielectric material. For example, the second back gate insulating pattern 121 may include a material having a dielectric constant of about 1 to about 4. For example, the second back gate insulating pattern 121 may include at least one of silicon oxide, SiOC, and air. For example, the third back gate insulating pattern 122 may include silicon nitride.

FIGS. 4, 5, 6, 7, 8, 9, 10, 11, 12, 13, 14, 15, 16, 17 and 18 are cross-sectional views corresponding to the line A-A' of FIG. 1 to illustrate a method of manufacturing a semiconductor memory device according to some embodiments of the disclosure. Hereinafter, similar aspects previously described with respect to FIGS. 1-3D may be omitted for ease and convenience in explanation.

Figure 4:
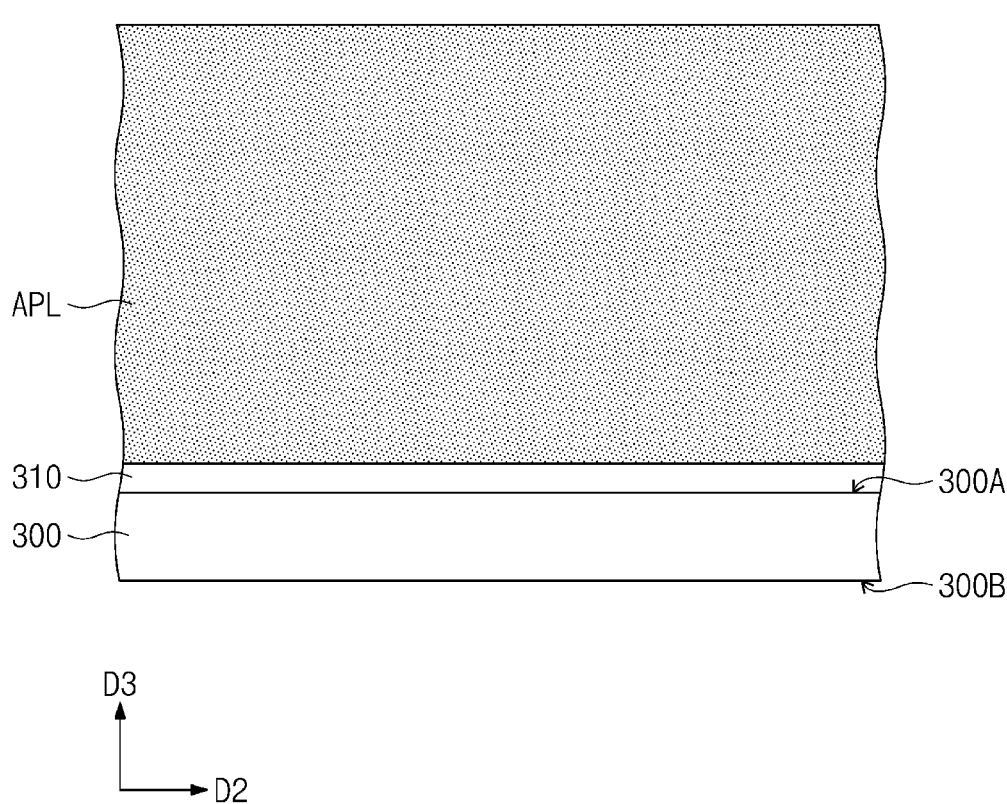
FIGS. 4, 5, 6, 7, 8, 9, 10, 11, 12, 13, 14, 15, 16, 17 and 18 are cross-sectional views corresponding to the line A-A' of FIG. 1 to illustrate a method of manufacturing a semiconductor memory device according to some embodiments of the disclosure.

Referring to FIG. 4, a stack in which a first substrate 300, an insulating layer 310 and an active layer APL are stacked may be prepared.

The insulating layer 310 and the active layer APL may be provided on the first substrate 300. The first substrate 300 may have a first surface 300A and a second surface 300B which are opposite to each other, and the first surface 300A of the first substrate 300 may be in contact with the insulating layer 310. The stack may be a silicon-on-insulator (SOI) substrate. For example, the first substrate 300 may be a silicon substrate, a germanium substrate, and/or a silicon-germanium substrate.

The insulating layer 310 may be a buried oxide (BOX) formed by a separation by implanted oxygen (SIMOX) method or a bonding and layer transfer method. Alternatively, the insulating layer 310 may be an insulating layer formed by a chemical vapor deposition (CVD) method. For example, the insulating layer 310 may include a silicon oxide layer, a silicon nitride layer, a silicon oxynitride layer, and/or a low-k dielectric layer.

The active layer APL may be a single-crystalline semiconductor layer. For example, the active layer APL may be a single-crystalline silicon substrate, a single-crystalline germanium substrate, and/or a single-crystalline silicon-germanium substrate. The active layer APL may have a first surface and a second surface which are opposite to each other, and the second surface of the active layer APL may be in contact with the insulating layer 310.

Figure 5:
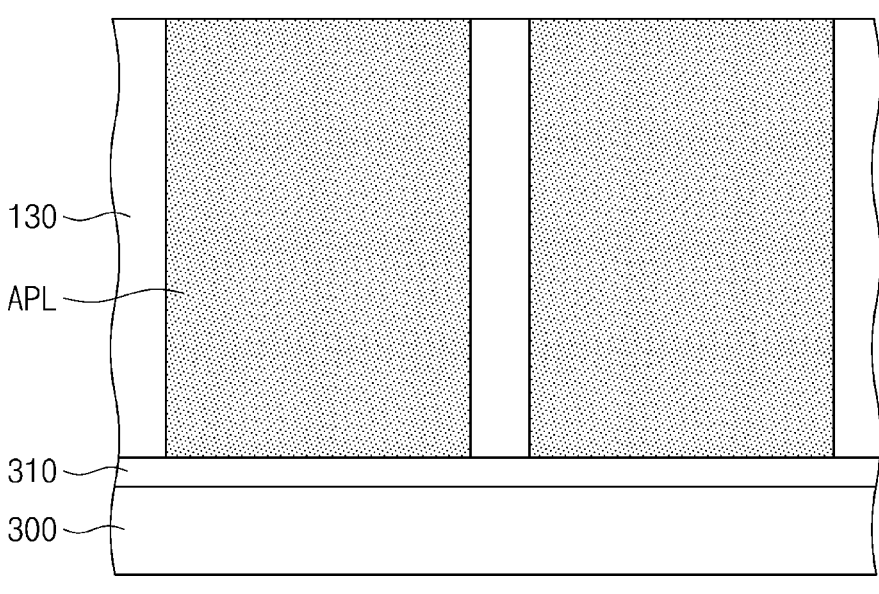

Referring to FIG. 5, a third insulating pattern 130 may be formed in the active layer APL. The active layer APL may be patterned to form a trench exposing the insulating layer 310, and then, the trench may be filled with an insulating material to form the third insulating pattern 130. A top surface of the third insulating pattern 130 may be substantially coplanar with the first surface of the active layer APL.

Figure 6:
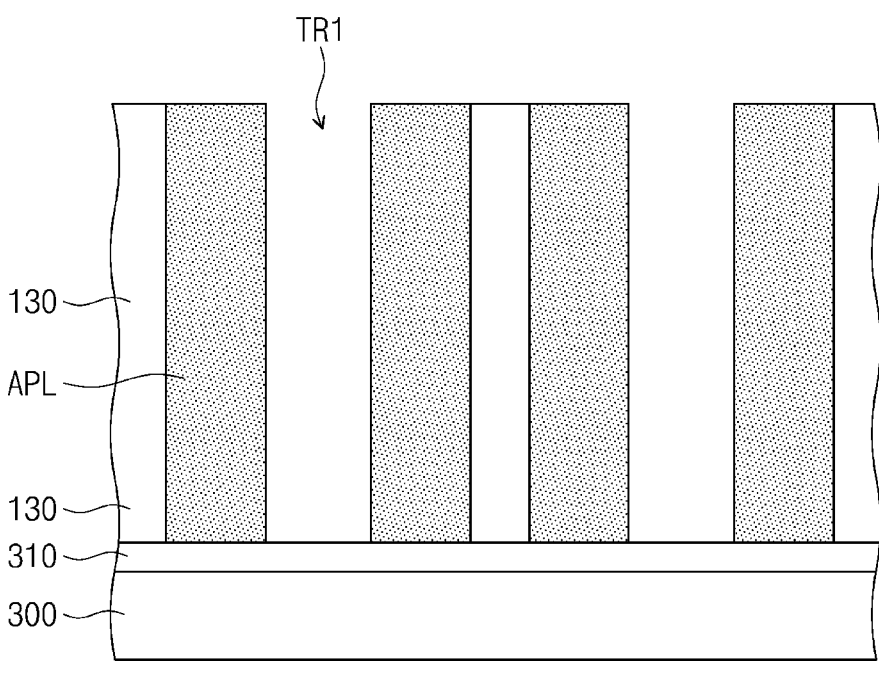
Figure 6:

Referring to FIG. 6, a first trench TR1 may be formed in the active layer APL. The first trench TR1 may expose a top surface of the insulating layer 310 and an inner side surface of the active layer APL. The first trench TR1 may have a line shape extending in the first direction D1. The first trench TR1 may be formed by patterning the active layer APL.

Figure 7:
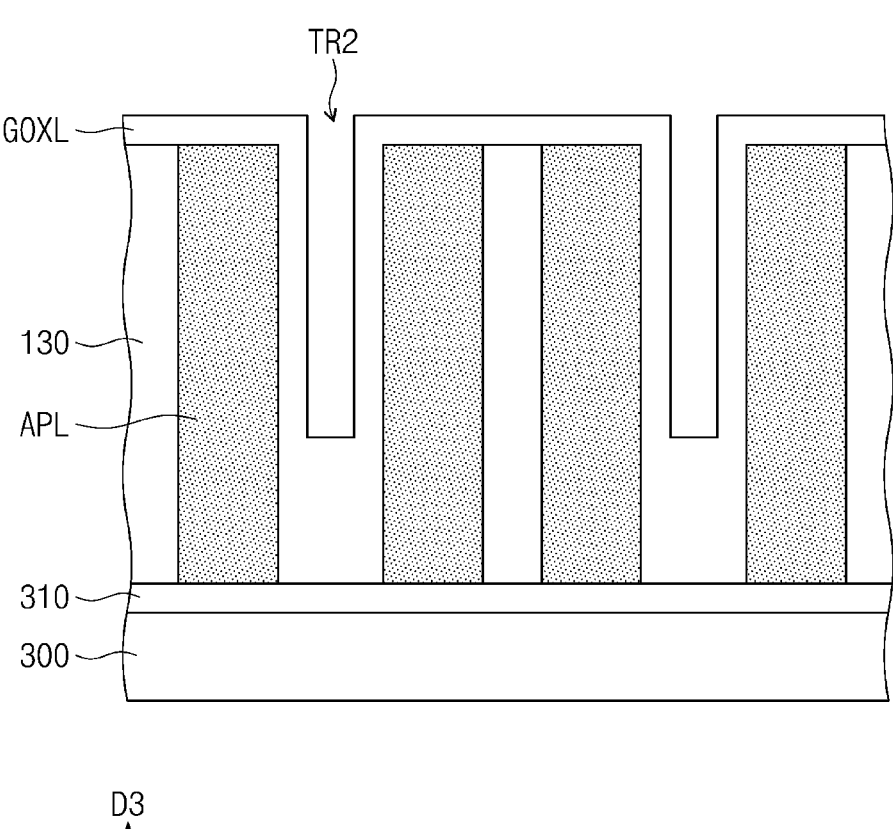

Referring to FIG. 7, a gate insulating layer GOXL may be formed on the first substrate 300. The gate insulating layer GOXL may cover (or at least partially cover) the top surface of the third insulating pattern 130, the first surface of the active layer APL and an inner surface of the first trench TR1. A second trench TR2 may be defined by the gate insulating layer GOXL formed in the first trench TR1.

Figure 8:
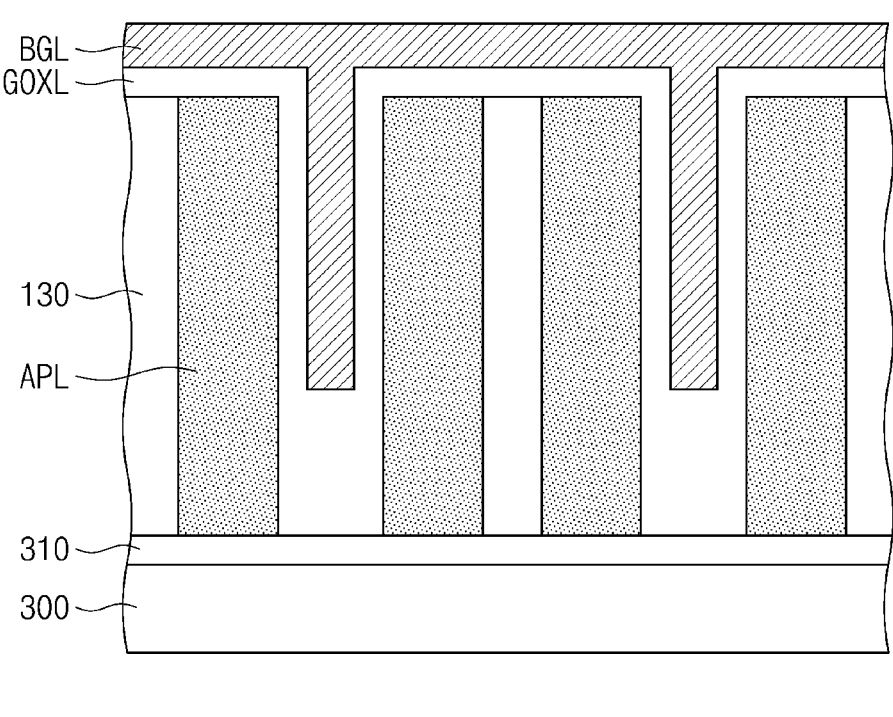

Referring to FIG. 8, a back gate layer BGL may be formed on the gate insulating layer GOXL. The back gate layer BGL may extend along a top surface of the gate insulating layer GOXL to fill the second trench TR2. The back gate layer BGL may conformally cover the top surface of the gate insulating layer GOXL.

Figure 9:
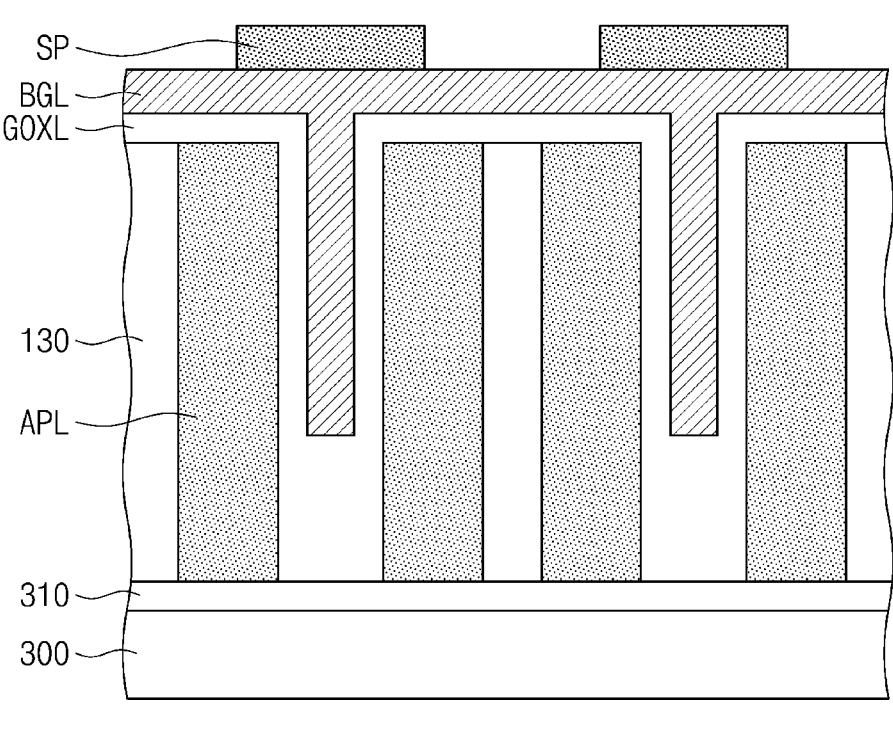

Referring to FIG. 9, spacers SP may be formed on the back gate layer BGL. The spacers SP may be formed of a material having an etch selectivity with respect to the back gate layer BGL and the gate insulating layer GOXL. The spacers SP may overlap with the active layer APL and the first trench TR1 when viewed in a plan view. The spacers SP may be spaced apart from each other.

Figure 10:
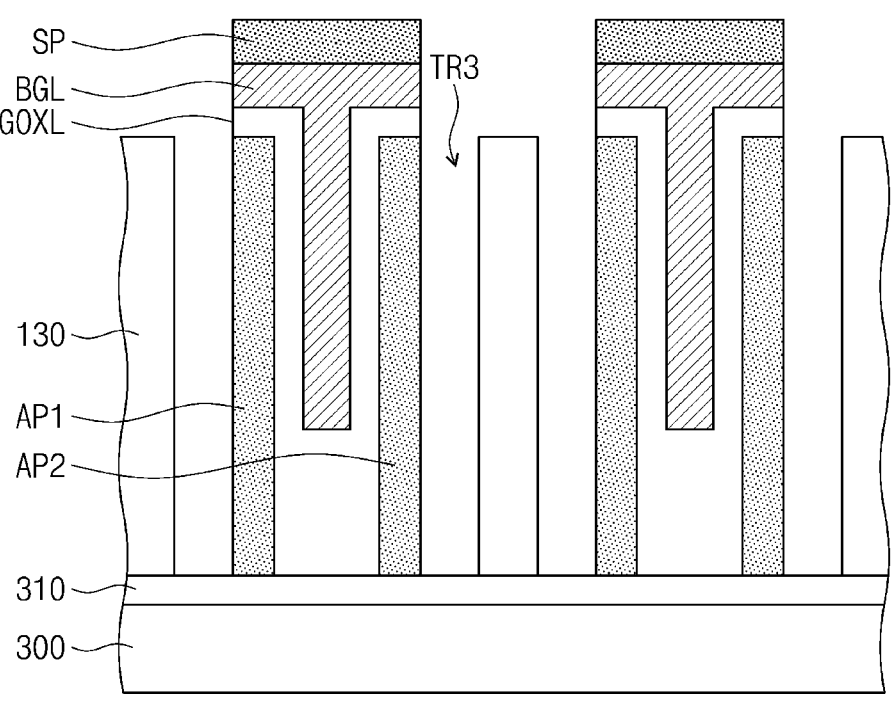

Referring to FIG. 10, an etching process may be performed on the back gate layer BGL, the gate insulating layer GOXL and the active layer APL to form a third trench TR3 and first and second active patterns AP1 and AP2. The etching process may sequentially etch the back gate layer BGL, the gate insulating layer GOXL and the active layer APL by using the spacers SP as etch masks. The third trench TR3 may expose the top surface of the insulating layer 310. The third trench TR3 may be formed between the third insulating pattern 130 and the first and second active patterns AP1 and AP2.

Figure 11:
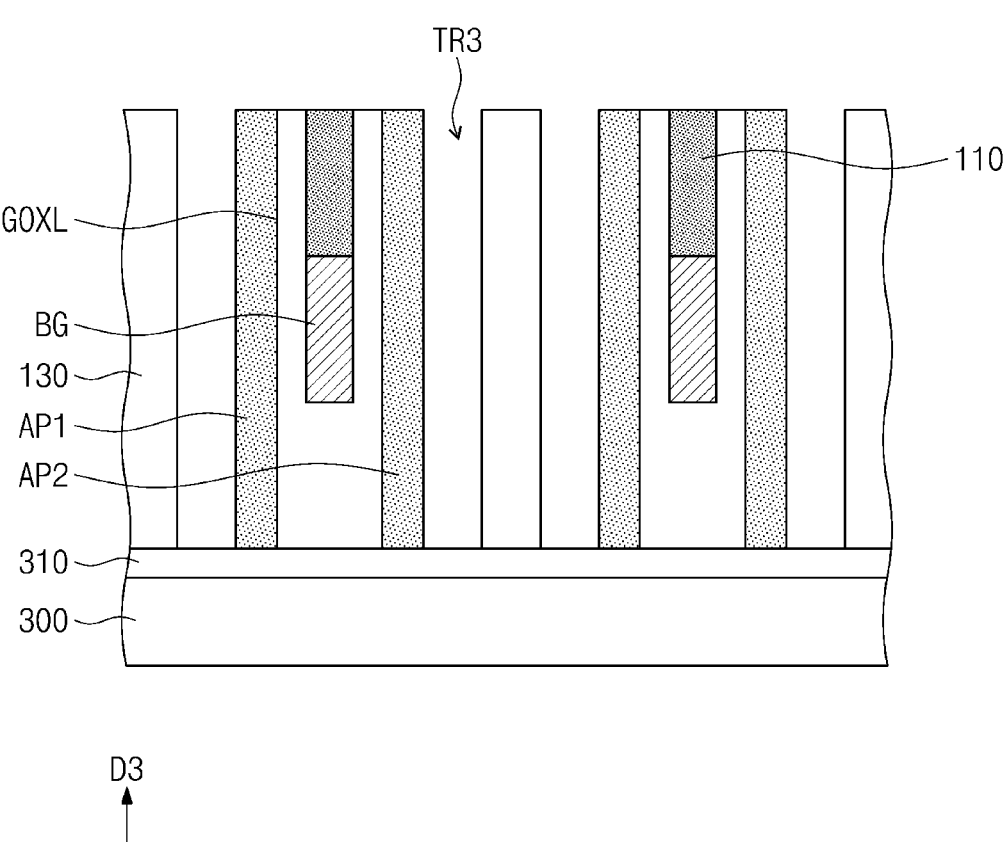

Referring to FIG. 11, back gate electrodes BG and back gate lower insulating patterns 110 may be formed. The back gate layer BGL and the gate insulating layer GOXL may be sequentially etched after the spacers SP are removed, thereby forming the back gate electrodes BG. The back gate lower insulating pattern 110 may be formed on each of the back gate electrodes BG. A top surface of the back gate lower insulating pattern 110, top surfaces of the first and second active patterns AP1 and AP2, a topmost surface of the gate insulating layer GOXL and the top surface of the third insulating pattern 130 may be substantially flat.

Figure 12:
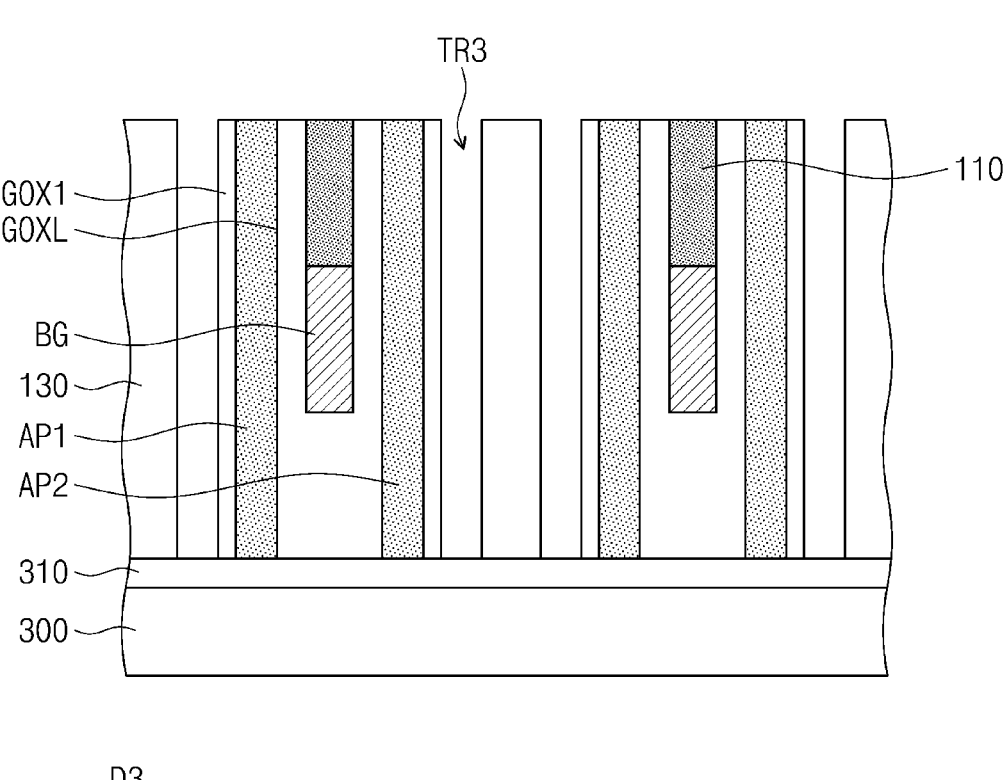

Referring to FIG. 12, a first gate insulating pattern GOX1 may be formed in the third trench TR3. The first gate insulating pattern GOX1 may cover (or at least partially cover) exposed side surfaces of the first and second active patterns AP1 and AP2 and may extend in the first direction D1.

Figure 13:
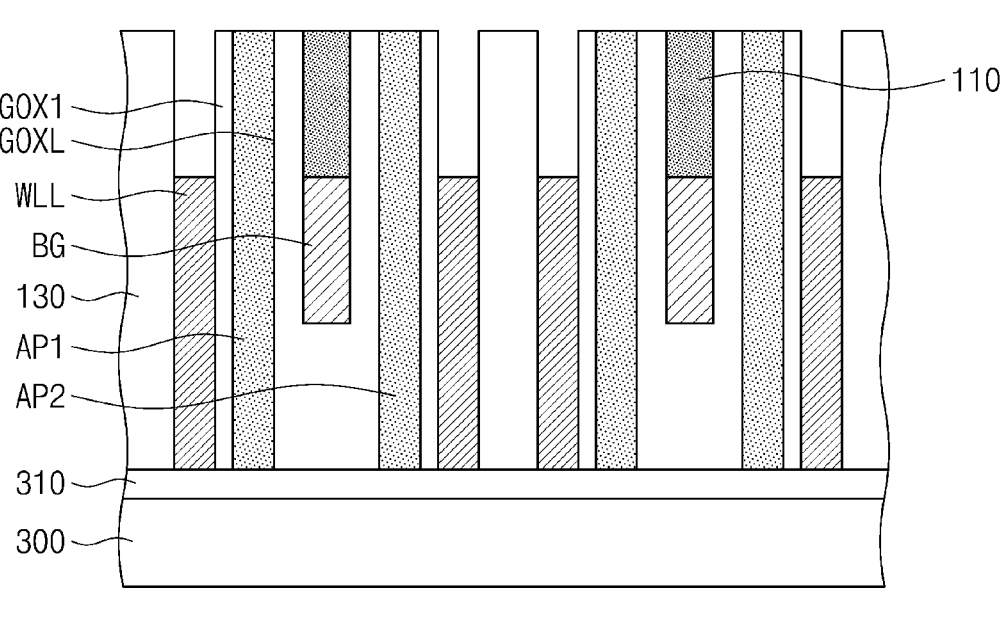

Referring to FIG. 13, a word line layer WLL may be formed on the insulating layer 310. The word line layer WLL may fill a space between the first gate insulating pattern GOX1 and the third insulating pattern 130. A top surface of the word line layer WLL may be located at a lower level than the top surfaces of the first and second active patterns AP1 and AP2. The word line layer WLL may extend in the first direction D1.

Figure 14:
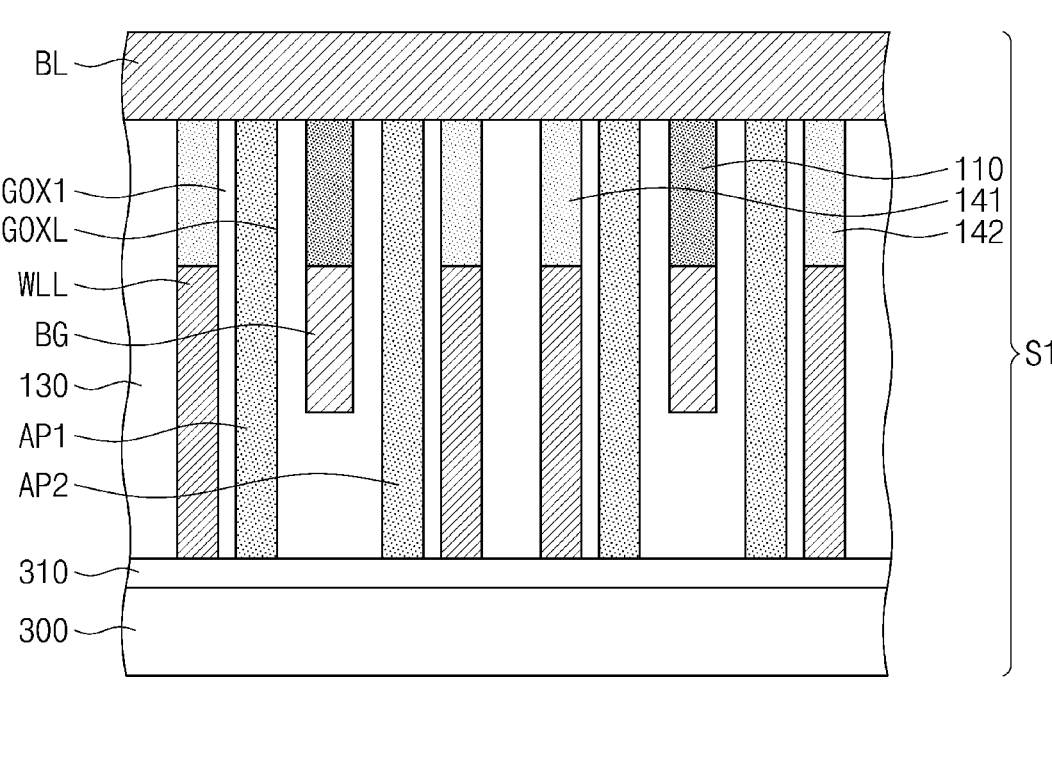

Referring to FIG. 14, first and second insulating patterns 141 and 142 may be formed on the word line layer WLL. The first and second insulating patterns 141 and 142 may fill spaces between the first gate insulating pattern GOX1 and the third insulating pattern 130. Top surfaces of the first and second insulating patterns 141 and 142 may be substantially coplanar with the top surfaces of the first and second active patterns AP1 and AP2.

Bit lines BL may be formed on the first, second and third insulating patterns 141, 142 and 130, the first gate insulating pattern GOX1, the first and second active patterns AP1 and AP2, and the back gate lower insulating pattern 110. Each of the bit lines BL may have a line shape extending in the second direction D2. Since the bit lines BL are formed, a first structure 51 may be manufactured.

Figure 15:
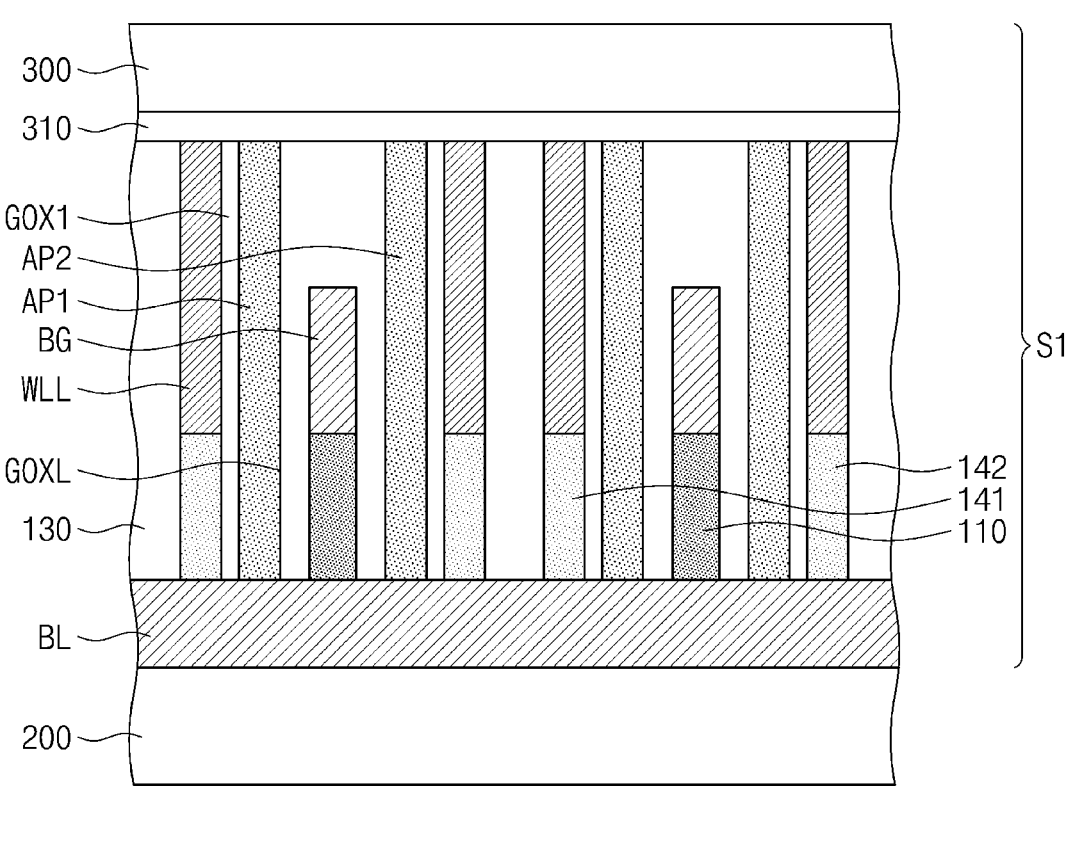

Referring to FIG. 15, the first structure 51 may be turned over in such a way that the second surface 300B of the first substrate 300 faces the third direction D3. The first structure 51 turned over may be disposed on a substrate 200.

Figure 16:
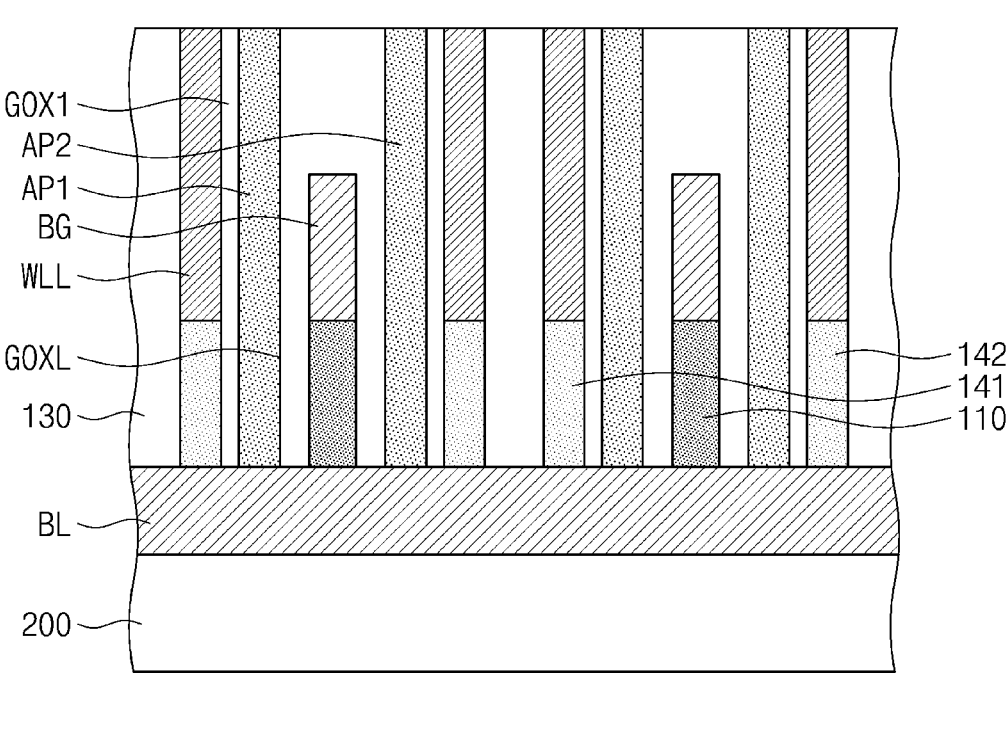

Referring to FIG. 16, the first substrate 300 and the insulating layer 310 may be removed. The first, second and third insulating patterns 141, 142 and 130, the first gate insulating pattern GOX1 and the first and second active patterns AP1 and AP2 may be exposed by the removal of the first substrate 300 and the insulating layer 310.

Figure 17:
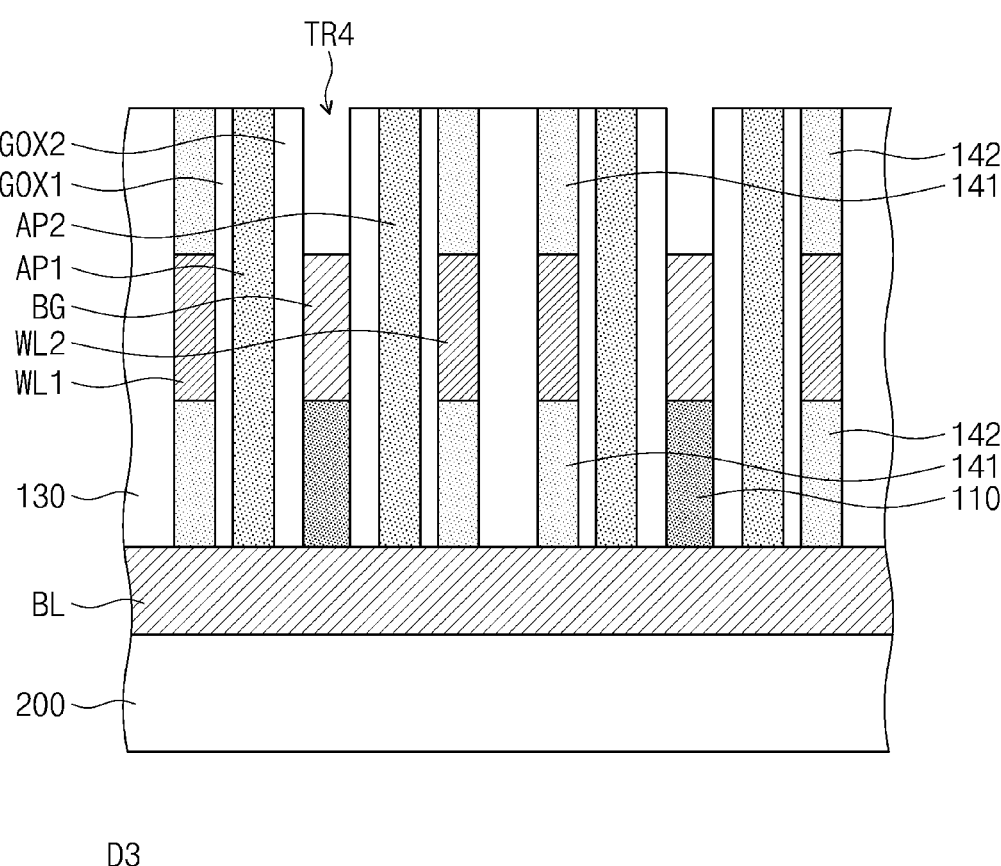

Referring to FIG. 17, the gate insulating layer GOXL may be etched to form a second gate insulating pattern GOX2 and a fourth trench TR4. The fourth trench TR4 may expose a top surface of each of the back gate electrodes BG.

Figure 18:
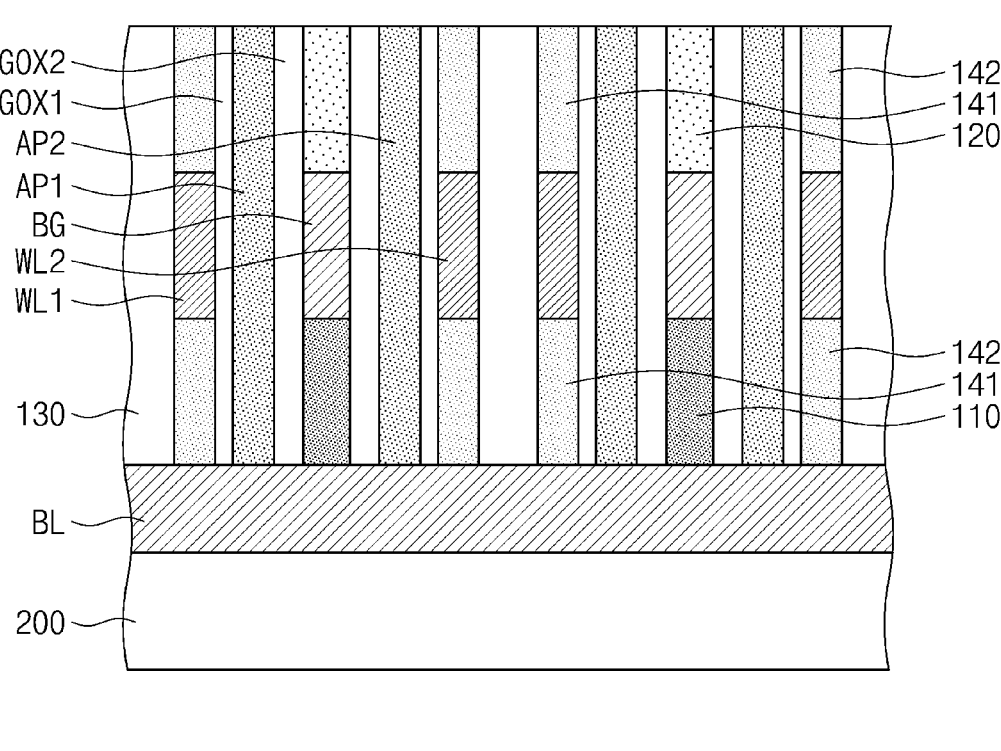

Referring to FIG. 18, a back gate upper insulating pattern 120 may be formed in the fourth trench TR4. The back gate upper insulating pattern 120 may fill a space (i.e., the fourth trench TR4) between the second gate insulating patterns GOX2 on each of the back gate electrodes BG. A top surface of the back gate upper insulating pattern 120 may be substantially coplanar with top surfaces of the first and second active patterns AP1 and AP2.

Referring again to FIG. 2A, an etch stop layer 210 and an interlayer insulating layer 220 may be formed on the first and second active patterns AP1 and AP2. Thereafter, the interlayer insulating layer 220 and the etch stop layer 210 may be patterned to expose the first and second active patterns AP1 and AP2, and then, contact patterns BC may be formed. Landing pads LP may be formed on the contact patterns BC, and then, the interlayer insulating layer 220 and the etch stop layer 210 may be etched, and then, separation insulating patterns 245 may be formed. Data storage patterns DSP may be formed on the landing pads LP, thereby manufacturing a semiconductor memory device.

According to the disclosure, in the semiconductor memory device including the back gate electrode, the insulating pattern disposed on the back gate electrode may include the low-k dielectric material, and thus noise between the contact patterns may be reduced or minimized to improve electrical characteristics of the semiconductor memory device.

Each of the embodiments provided in the above description is not excluded from being associated with one or more features of another example or another embodiment also provided herein or not provided herein but consistent with the disclosure.

While the embodiments of the disclosure have been particularly shown and described, it will be understood by one of ordinary skill in the art that variations in form and detail may be made therein without departing from the spirit and scope of the attached claims.

What is claimed is:

1. A semiconductor memory device comprising:
a bit line extending in a first direction;
a first word line extending in a second direction intersecting the first direction on the bit line;
a second word line extending in the second direction and spaced apart from the first word line in the first direction;
a back gate electrode extending in the second direction between the first word line and the second word line;
first active patterns provided between the first word line and the back gate electrode, the first active patterns being spaced apart in the second direction;
second active patterns provided between the second word line and the back gate electrode, the second active patterns being spaced apart in the second direction;
contact patterns connected to the first active patterns and the second active patterns;
a back gate lower insulating pattern provided between the back gate electrode and the bit line; and
a back gate upper insulating pattern provided on the back gate electrode,
wherein the back gate upper insulating pattern comprises a material having a first dielectric constant and the back gate lower insulating pattern comprises a material having a second dielectric constant that is greater than the first dielectric constant.

2. The semiconductor memory device of claim 1, wherein the first dielectric constant is between about 1 to about 4.

3. The semiconductor memory device of claim 1, wherein the back gate lower insulating pattern and the back gate upper insulating pattern are vertically spaced apart, and
wherein the back gate electrode between the back gate lower insulating pattern and the back gate upper insulating pattern.

4. The semiconductor memory device of claim 1, wherein the contact patterns comprise first contact patterns connected to the first active patterns and second contact patterns connected to the second active patterns,
wherein at least a portion of the first contact patterns is spaced apart from at least a portion of the second contact patterns, and
wherein the back gate upper insulating pattern is provided between the portion of the first contact patterns and the portion of the second contact patterns.

5. The semiconductor memory device of claim 1, wherein the back gate upper insulating pattern contacts a top surface of the back gate electrode, and
wherein the back gate upper insulating pattern extends in a third direction that is perpendicular to the first direction and the second direction.

6. The semiconductor memory device of claim 1, wherein the first active patterns and the second active patterns are formed of a single-crystalline semiconductor material.

7. The semiconductor memory device of claim 1, wherein the back gate upper insulating pattern comprises at least one of silicon oxide, SiOC, and air.

8. A semiconductor memory device comprising:
a substrate;
a bit line on the substrate;
word lines provided on the bit line and spaced apart in a first direction parallel to a top surface of the substrate;

a back gate electrode provide between a pair of adjacent word lines among the word lines;
active patterns provided between the back gate electrode and the pair of adjacent word lines;
contact patterns respectively provided on the active patterns;
a first back gate insulating pattern provided between the bit line and the back gate electrode; and
a second back gate insulating pattern and a third back gate insulating pattern which are provided on the back gate electrode,
wherein the second back gate insulating pattern comprises a material having a first dielectric constant and the third back gate insulating pattern comprises a material having a second dielectric constant that is greater than the first dielectric constant.

9. The semiconductor memory device of claim 8, wherein the second back gate insulating pattern is provided between the back gate electrode and the third back gate insulating pattern.

10. The semiconductor memory device of claim 9, wherein the second back gate insulating pattern contacts a top surface of the back gate electrode, and
wherein the third back gate insulating pattern contacts a top surface of the second back gate insulating pattern.

11. The semiconductor memory device of claim 8, wherein a first portion of the third back gate insulating pattern is provided between the back gate electrode and the second back gate insulating pattern, and
wherein the second back gate insulating pattern is provided between the first portion of the third back gate insulating pattern and a remaining portion of the third back gate insulating pattern.

12. The semiconductor memory device of claim 11, wherein the third back gate insulating pattern contacts a top surface of the back gate electrode, and
wherein the third back gate insulating pattern extends along a top surface and a bottom surface of the second back gate insulating pattern.

13. The semiconductor memory device of claim 8, wherein the third back gate insulating pattern at least partially surrounds the second back gate insulating pattern, and
wherein the third back gate insulating pattern contacts a top surface of the back gate electrode.

14. The semiconductor memory device of claim 8, wherein the first dielectric constant is between about 1 to about 4.

15. The semiconductor memory device of claim 8, wherein the second back gate insulating pattern is provided between the contact patterns in the first direction.

16. The semiconductor memory device of claim 8, wherein the second back gate insulating pattern comprises at least one of silicon oxide, SiOC, and air.

17. The semiconductor memory device of claim 8, wherein the first back gate insulating pattern, the second back gate insulating pattern and the third back gate insulating pattern extend in a second direction that is parallel to the top surface of the substrate and that is perpendicular to the first direction.

18. A semiconductor memory device comprising:
a substrate;
a bit line extending in a first direction on the substrate;
a first active pattern;
a second active pattern spaced apart from the first active pattern in the first direction on the bit line;

a back gate electrode provided between the first active pattern and the second active pattern, the back gate electrode extending in a second direction and intersecting the bit line;

a first word line provided adjacent to the first active pattern and extending in the second direction;

a second word line provided adjacent to the second active pattern and extending in the second direction;

at least one first gate insulating pattern provided between the first active pattern and the first word line;

at least one second gate insulating pattern provided between the second active pattern and the second word line;

at least one third gate insulating pattern provided between the first active pattern and the back gate electrode, at least one fourth gate insulating pattern provided between the second active pattern and the back gate electrode;

contact patterns connected to the first active pattern and the second active pattern;

a back gate lower insulating pattern provided between the bit line and the back gate electrode;

a back gate upper insulating pattern provided on the back gate electrode and between the contact patterns;

at least one first insulating pattern provided between the first word line and the bit line, at least one second insulating pattern provided between the first word line and a corresponding contact pattern of the contact patterns;

at least one third insulating pattern provided between the second word line and the bit line;

at least one fourth insulating pattern provided between the second word line and a corresponding contact pattern of the contact patterns; and data storage patterns respectively connected to the contact patterns, wherein the back gate upper insulating pattern comprises a material having a first dielectric constant and the back gate lower insulating pattern comprises a material having a second dielectric constant that is greater than the first dielectric constant.

19. The semiconductor memory device of claim 18, wherein the first dielectric constant is between about 1 to about 4.

20. The semiconductor memory device of claim 18, wherein the back gate upper insulating pattern comprises at least one of silicon oxide, SiOC, and air.

* * * * *